(12) United States Patent
Wu et al.

(10) Patent No.: US 9,293,418 B2
(45) Date of Patent: Mar. 22, 2016

(54) BACKSIDE THROUGH VIAS IN A BONDED STRUCTURE

(71) Applicant: Taiwan Semiconductor Manufacturing Company, Ltd., Hsin-Chu (TW)

(72) Inventors: Weng-Jin Wu, Hsin-Chu (TW); Ku-Feng Yang, Baoshan Township (TW); Hung-Pin Chang, Taipei (TW); Wen-Chih Chiou, Zhunan Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/263,520

(22) Filed: Apr. 28, 2014

(65) Prior Publication Data

US 2014/0232013 A1    Aug. 21, 2014

Related U.S. Application Data

(63) Continuation-in-part of application No. 11/773,171, filed on Jul. 3, 2007, now abandoned.

(51) Int. Cl.

| | |
|---|---|
| *G01R 31/26* | (2014.01) |
| *H01L 23/538* | (2006.01) |
| *B24B 37/013* | (2012.01) |
| *B24B 7/22* | (2006.01) |
| *H01L 21/304* | (2006.01) |
| *H01L 21/306* | (2006.01) |
| *H01L 21/768* | (2006.01) |
| *H01L 21/66* | (2006.01) |

(52) U.S. Cl.
CPC ............ *H01L 23/5384* (2013.01); *B24B 7/228* (2013.01); *B24B 37/013* (2013.01); *H01L 21/304* (2013.01); *H01L 21/30625* (2013.01); *H01L 21/76898* (2013.01); *H01L 22/26* (2013.01); *H01L 22/30* (2013.01); *H01L 22/12* (2013.01); *H01L 22/14* (2013.01); *H01L 22/34* (2013.01); *H01L 2924/0002* (2013.01)

(58) Field of Classification Search
USPC .......................................................... 438/14
See application file for complete search history.

(56) References Cited

U.S. PATENT DOCUMENTS

| | | | |
|---|---|---|---|
| 6,546,820 | B1 | 4/2003 | Van et al. |
| 6,811,853 | B1 * | 11/2004 | Sherrer et al. ................. 428/138 |
| 6,930,382 | B2 | 8/2005 | Sawada et al. |
| 7,090,562 | B1 | 8/2006 | Boyd et al. |
| 8,916,471 | B1 * | 12/2014 | Yang et al. .................... 438/667 |
| 2004/0237413 | A1 | 12/2004 | Shida et al. |
| 2005/0158889 | A1 | 7/2005 | Brouillette et al. |
| 2006/0172666 | A1 | 8/2006 | Hikita et al. |
| 2007/0090490 | A1 * | 4/2007 | Chang et al. .................. 257/621 |
| 2011/0266691 | A1 * | 11/2011 | Lin et al. ....................... 257/774 |

* cited by examiner

*Primary Examiner* — Shaun Campbell
(74) *Attorney, Agent, or Firm* — Slater & Matsil, L.L.P.

(57) ABSTRACT

A wafer thinning system and method are disclosed that includes grinding away substrate material from a backside of a semiconductor device. A current change is detected in a grinding device responsive to exposure of a first set of device structures through the substrate material, where the grinding is stopped in response to the detected current change. Polishing repairs the surface and continues to remove an additional amount of the substrate material. Exposure of one or more additional sets of device structures through the substrate material is monitored to determine the additional amount of substrate material to remove, where the additional sets of device structures are located in the semiconductor device at a known depth different than the first set.

20 Claims, 19 Drawing Sheets

BACKSIDE THROUGH VIAS IN A BONDED STRUCTURE

CROSS-REFERENCE TO RELATED APPLICATIONS

This application is a continuation-in-part of, and claims the benefit of, U.S. patent application Ser. No. 11/773,171, filed Jul. 3, 2007, which application is incorporated herein by reference.

BACKGROUND

A semiconductor wafer generally includes a first or "front" side having integrated circuits formed thereon, and a backside comprising a thickness of a semiconductor material (e.g., silicon (Si), gallium arsenide (GaAs), or the like) either in a bulk Si/semiconductor wafer or a Si/semiconductor on insulator (SOI) package. Prior to the dicing and packaging of the individual integrated circuit chips, the backside of the wafer is typically thinned to remove unwanted semiconductor material.

There are several different bonding and wafer thinning processes that are currently used depending on the type of semiconductor substrate (e.g., SOI vs. bulk Si) or on the point in the process at which via are formed (i.e., before or after bonding). When using SOI substrates, the typical procedure temporarily bonds the first wafer die to a glass layer. The backside of the SOI wafer is then usually wet etched to an etch stop layer leaving the backside substrate around 1.8 μm thick. The etched wafer die is then bonded to another wafer, after which the glass layer is removed from the first wafer die. Once the multiple layers are bonded, via are formed to establish interlayer connections.

When bulk Si is used, one method begins with a first wafer die that includes back-end-of-the-line (BEOL) connections. This first wafer die is bonded to a surface of another wafer, after which the backside substrate is thinned. Once the thinning process is completed, via are then formed to establish interlayer connections.

A second method used in bulk Si wafers forms via before the bonding process. In this method, the first wafer die not only includes the active device connections, but also has the interconnecting via formed. After bonding to another wafer, the backside thinning works to expose backside connections to the pre-fabricated via.

The backside grinding process reduces the thickness of the integrated circuit chips, allows smaller packaging, provides better stress performance in laminated packages, and provides other known benefits. Existing control methods for backside grinding typically rely on the mechanical precision of the grinding tool to control the accuracy of the final thickness of the wafer. For ultra-thin three-dimensional (3D) integrated circuit (IC) wafers, the backside may be thinned to between 20-30 μm. Such thickness requirements may risk damage to the active device layer if the mechanism to determine material thickness during the backside grinding process is not accurate.

Existing methods for controlling the mechanical backside grinding process typically use a mechanical thickness dial gauge to identify the specific width or thickness for the grinding element to leave in tact. However, because the dial gauge itself is a mechanical process, its accuracy is intrinsically limited. FIGS. 1A-1C are cross-sectional diagrams illustrating a typical wafer grinding process. In FIG. 1A, semiconductor die 10, including, among other things, bulk Si 100, through Si via (TSV) 101, and passivation layer 102, is bonded to semiconductor die 11, including, among other things, bulk Si 104 and passivation layer 103. After semiconductor dies 10 and 11 are bonded together to form stacked die 12, as illustrated in FIG. 1B, processing machine 13 applies grinding surface 105 to grind away much of bulk Si 100 from stacked die 12. The thickness dial gauge (not shown) of processing machine 13 is set to stop grinding bulk Si 100 at a desired coarse thickness, typically between 50 and 30 μm.

Because the grinding process provides such a coarse grinding mechanism, the top most layer of Si of stacked wafer 12 is typically damaged, which generally prompts additional fine polishing to finish out the processing. Chemical mechanical polishing (CMP) or the like is usually performed over the damaged surface to create a more useful planarized surface in addition to more finely thinning stacked wafer 12. FIG. 1C illustrates processing machine 13 applying polishing surface 106 to continue finely thinning and repairing the top surface of stacked wafer 12. The CMP is continued until the thickness of bulk Si 100 reaches the desired amount, typically between 30 and 20 μm. Once this desired thickness is reached, TSV 101 is usually exposed for external connection to stacked wafer 12. During the CMP process, endpoint detection (EPD) is generally needed to detect the desired endpoint of the thinning. This EPD may be implemented through a time control (i.e., conducting CMP for a specified time which, in consideration of the polishing rate, should indicate a depth that the polishing will result in after the specified time). It may also be implemented through some kind of optical metrology, including optical microscopes (OM), infrared (IR) measurement, laser detection, or similar such optical measurement systems.

The precise control to implement the accuracy of the grinding/thinning process is, therefore, limited by the accuracy of the mechanical thickness dial, followed by complicated optical verification systems. If the dial cannot sufficiently control the exact depth desired, grinding may actually cross into an active device area potentially ruining the operability of the semiconductor device.

One method that was developed to overcome the problems in the grinding portion of wafer thinning is described in U.S. Patent Publication No.: 2005/0158889 by Brouillette, et al., (hereinafter "Brouillette"). Instead of relying on a mechanical thickness dial, the thickness of the semiconductor wafer is measured using optical metrology. Specifically, IR light is directed onto the semiconductor wafer. Based on the reflective and refractive properties of the semiconductor material, the system analyzes the reflected IR light wavelengths to determine the thickness of the wafer. However, while the Brouillette method provides wafer measurement without the use of physically-limited mechanical dials, the costs of the optical equipment is generally quite high. Moreover, the grinding process is typically halted each time an IR measurement is to take place. Therefore, the grinding process is slowed decreasing the overall though-put of the manufacturing process. Further still, because the grinding process is halted to perform the measurement, care is still warranted to prevent grinding into the active layers of the wafer between measurements.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a two-layer 3D IC semiconductor device with TSV formed as the thickness indicator. The invention may also be applied, however, to various other multilayer semiconductor devices, and the thickness indicators may be any type of device structure, such as trenches, TSV, alignment marks, combinations thereof, and the like.

Figure 1A:
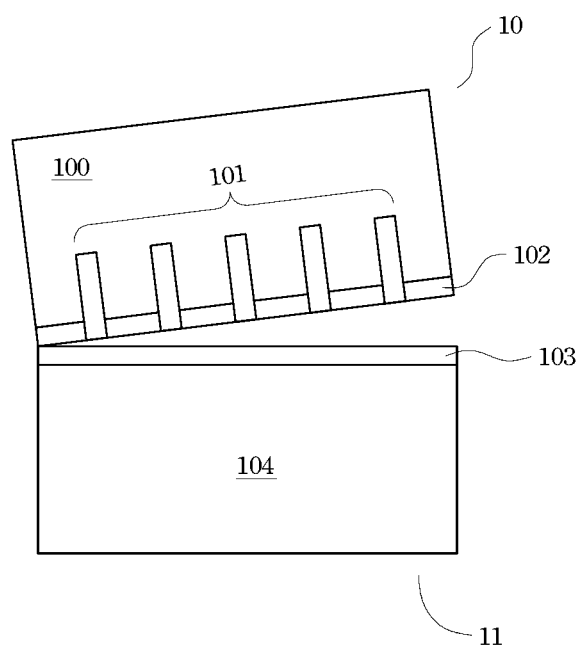
FIGS. 1A-1C are cross-sectional diagrams illustrating a typical wafer grinding process.
Figure 1B:
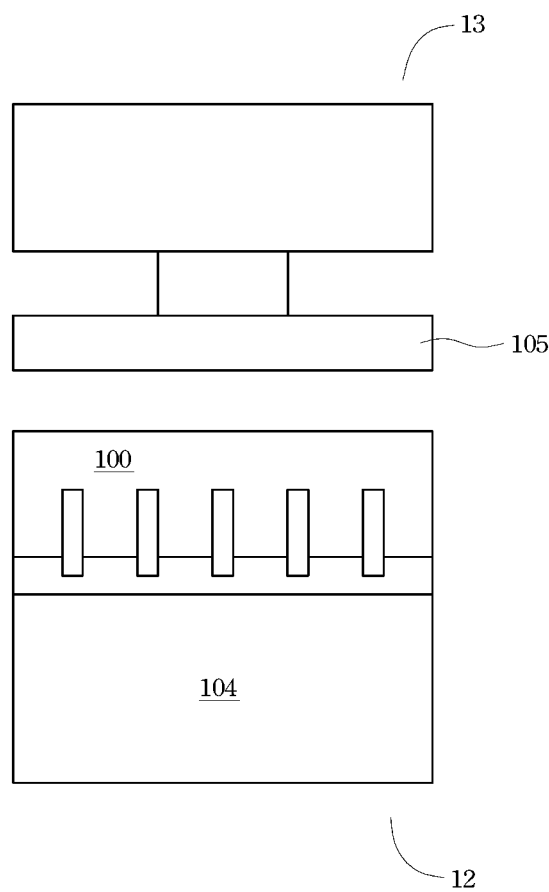
Figure 1C:
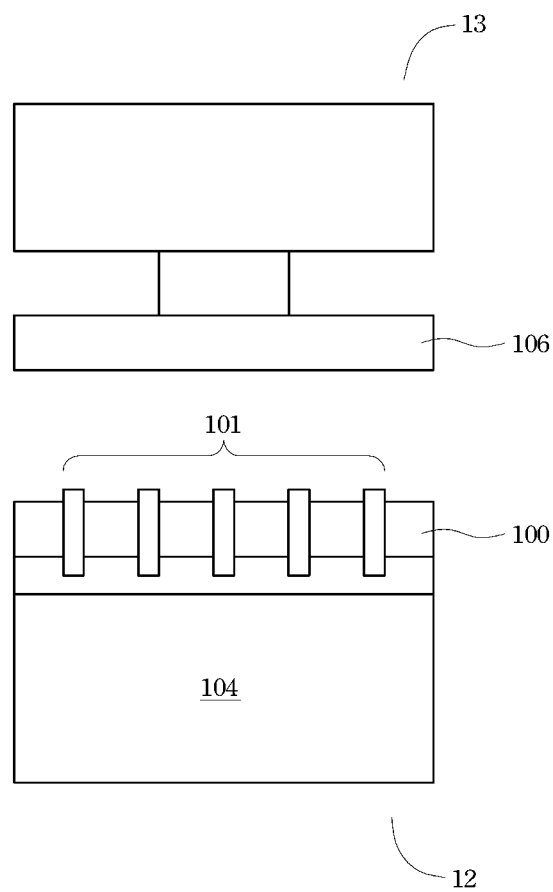
Figure 2A:
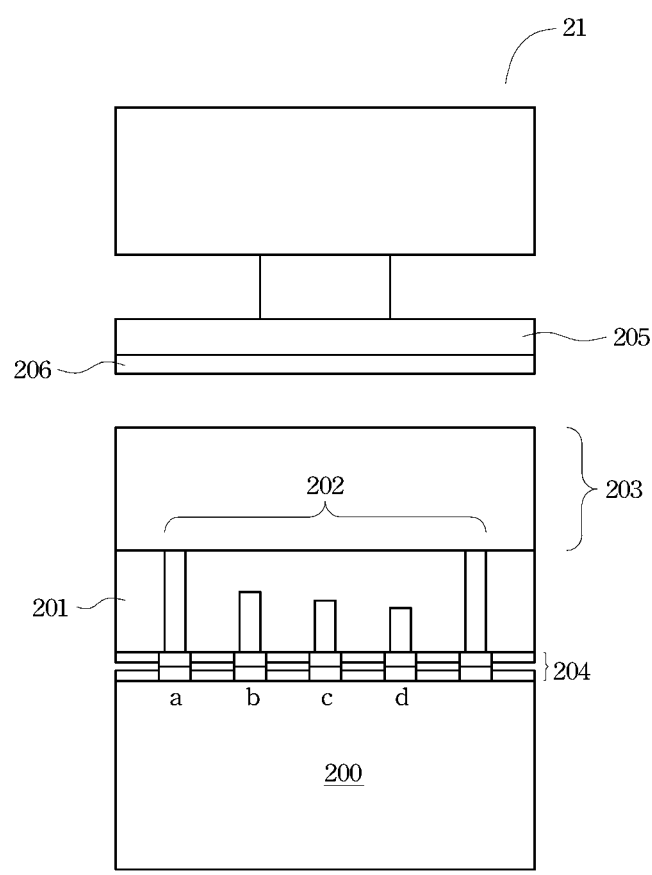
FIGS. 2A-2B are cross-sectional views of a stacked wafer during a wafer thinning process configured according to one embodiment of the present invention.

With reference now to FIG. 2A, there is shown a cross-sectional view of stacked wafer 20 during a thinning process configured according to one embodiment of the present invention. Stacked wafer 20 comprises two semiconductor dies connected at bonding layer 204 and having front-side substrate 200 and backside substrate 201. The grinding process begins with processing system 21 applying grinding surface 206 to the backside of stacked wafer 20. Processing system 21 may comprise any number of various mechanical grinding and polishing systems. Processing system 21 removes substrate amount 203 from the backside in order to leave a desired maximum grinding thickness. The backside die also comprises TSV 202 which has been formed into a pattern having varying, known specific depths. As grinding surface 206 gets close to TSV 202a, current sensor 205 detects an increase in current passing through the wheel or platen motor of processing system 21 or eddy currents that may arise during the grinding. This increase in current indicates to processing system 21 that TSV 202a is getting close. TSV 202a is known to be formed at a specific depth which represents a specific remaining thickness of substrate 201.

Eddy current is an electrical phenomenon caused when a moving (or changing) magnetic field intersects a conductor, or vice-versa. The relative motion causes a circulating flow of electrons, or current, within the conductor. These circulating eddies of current create electromagnets with magnetic fields that generally oppose the effect of the applied magnetic field. The stronger the applied magnetic field, or greater the electrical conductivity of the conductor, or greater the relative velocity of motion, the greater the currents developed and the greater the opposing field.

In the example embodiment depicted in FIG. 2A, the thickness represented by TSV 202a corresponds to the thickness at which point the grinding process is to stop. Thus, when processing system 21 detects the corresponding increased current through current sensor 205, grinding stops at the appropriate depth.

Figure 2B:
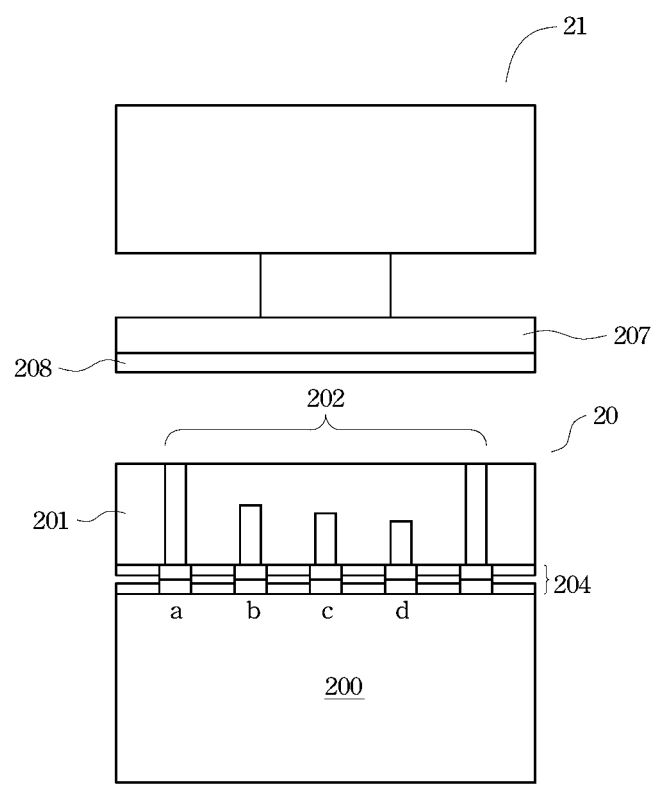

FIG. 2B is a cross-sectional view of stacked wafer 21 during a wafer thinning process configured according to one embodiment of the present invention. After coarse grinding by grinding surface 206 is complete, processing system 21 applies fine polishing surface 208 to continue removing desired portions of backside substrate 201. Processing system 21 also includes current detector 207 associated with fine polishing surface 208 in order to detect wheel or platen motor current and/or eddy current that is encountered during the polishing of stacked wafer 20. As processing system 21 removes more of backside substrate 201, fine polishing surface 208 will come into contact with more of TSV 202. In response to this contact, the wheel or platen motor current or eddy currents begin to rise. Current sensor 207 will sense this increase and signal to processing system 21 when to stop polishing to reach the desired thickness.

Because the TSV are formed at varying, known depths, they may also be used as a thickness indicator not only during the wafer thinning process but in the after thinning inspection (ATI) as well. For example, a desired thickness may leave enough backside substrate to keep particular TSV unexposed. The actual thickness may then be indicated through techniques such as pattern recognition, optical microscopes, scanning electron microscopes, or the like. When some TSV are exposed and others remain covered by the substrate, a pattern forms on the backside surface. (e.g., see FIG. 4) Additionally, a cross-sectional inspection of a given device will reveal the relationship between the top surface of the backside substrate and the closest TSV. As the TSV are at known depths, the thickness of the backside substrate will be easier to estimate.

It should be noted that the TSV formed for implementing the various embodiments of the present invention are accurately formed within any given wafer substrate using any known and reliable process of TSV formation. In preferred embodiments of the present invention, the TSV formed are formed to have a high depth-to-width ratio. For example, the Bosch etching process employs a deep reactive ion etching that uses two different gas types in the reactor, which can achieve etching ratios of up to around 50:1.

By providing the TSV in the systematic arrangement of known depths, the various embodiments of the present invention not only allow for determining endpoints during the thinning process but also provide assistance in ATI. ATI is the process in which the thinned wafer is inspected to determine its thickness, as well as any damage that may have occurred by the thinning process.

Figure 3A:
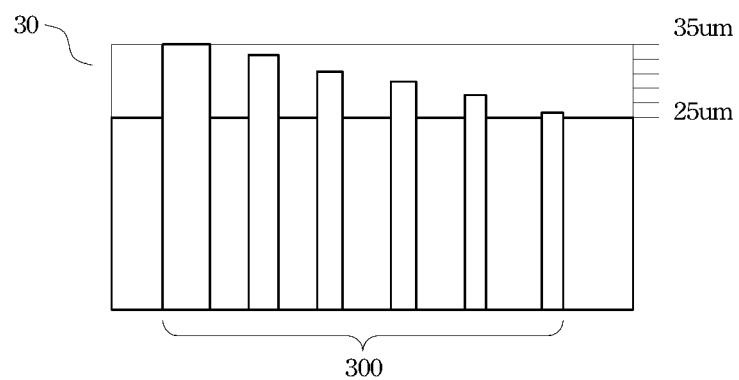
FIGS. 3A-3B are cross-sectional views of a wafer having a thickness indicator configured according to one embodiment of the present invention.

FIG. 3A is a cross-sectional view of wafer 30 having thickness indicator 300 configured according to one embodiment of the present invention. Thickness indicator 300 comprises a group of TSV formed at different specific gradient depths within wafer 30. A distance of 10 μm is illustrated (35 μm-25 μm). With six TSV making up thickness indicator 300, there is an approximate graded difference of 2 μm between the deepest and shallowest TSV. Therefore, depending on which TSV are exposed in thickness indicator 300, the thickness of the backside substrate of wafer 30 may be determined.

Figure 3B:
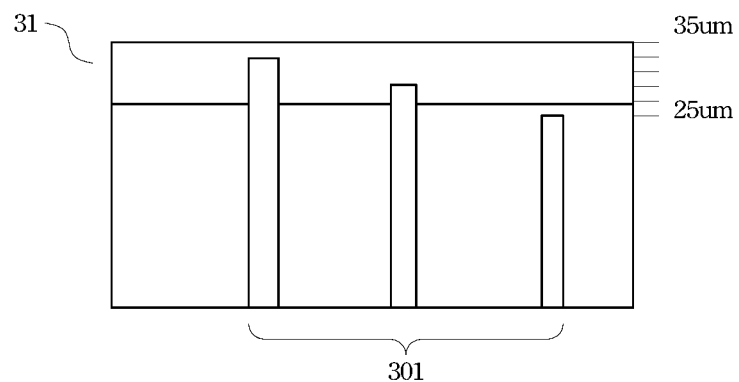

FIG. 3B is a cross-sectional view of wafer 31 having thickness indicator 301 configured according to one embodiment of the present invention. The embodiment represented with thickness indicator 301 illustrates that various measurement points may be provided. In wafer 31, thickness indicator 301 comprises three TSV also spanning a gradient depth of 10 μm. Therefore, an approximate difference of 5 μm exists between the deepest and shallowest TSV of thickness indicator 301.

Figure 4A:
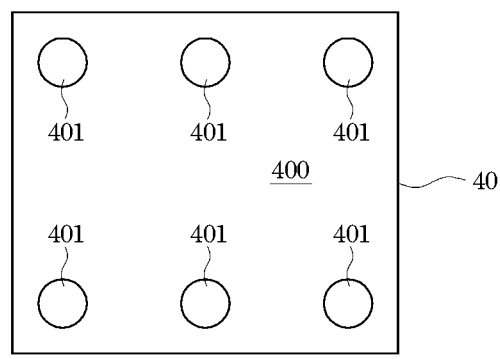
FIGS. 4A-4D are planar top views of successive patterns formed on a surface of a stacked wafer during a wafer thinning process configured according to one embodiment of the present invention.

FIGS. 4A-4D are planar top views of successive patterns formed on a surface of stacked wafer 40 during a wafer thinning process configured according to one embodiment of the present invention. In FIG. 4A, the grinding portion of the wafer thinning process has removed backside substrate 400 to reach TSV 401. The wafer thinning system according to one embodiment of the present invention has formed multiple TSV within the top die of stacked wafer 40. The current illustrated example includes four sets of graded-depth TSV. The multiple TSV are formed at known, graded depths. For purposes of the example embodiment depicted in FIGS. 4A-4D, the TSV extend from a backside substrate thickness of from 35 μm to 20 μm. TSV 401 were formed as the deepest TSV in the wafer thinning system of stacked wafer 40 in which the thickness of the backside substrate with the pattern formed in FIG. 4A is approximately 35 μm.

Figure 4B:
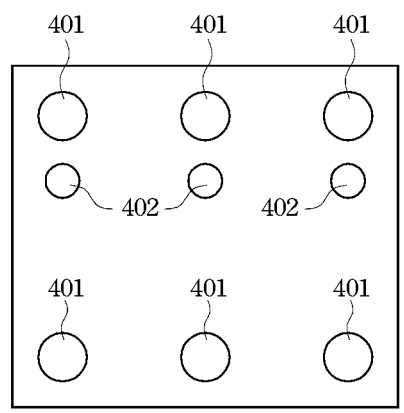

At 35 μm, the wafer thinning processes switches from the coarse grinding over to the finer polishing. In FIG. 4B, a new pattern has been formed as backside substrate 400 is further removed during polishing. The pattern comprises TSV 401 and TSV 402. A pattern recognition sensor (not shown) views a scanned image of the substrate surface to detect the pattern of TSV 401 and 402 and recognize that the thickness of backside substrate 400 is now at 30 μm. Because four sets of TSV make up the illustrated wafer thinning system, the difference in depth between each successive set of TSV is approximately 5 μm.

Figure 4C:
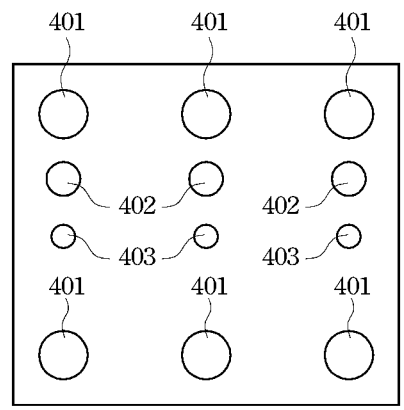
Figure 4D:
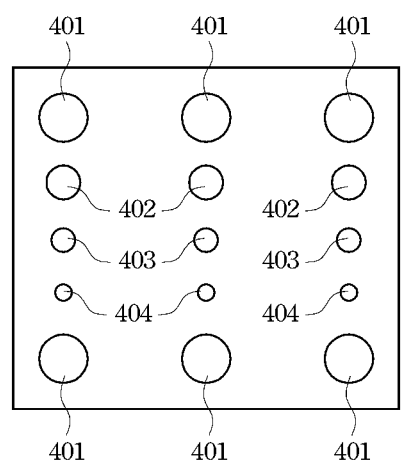

The wafer thinning process continues with polishing to repair and remove further semiconductor material, reducing the thickness of backside substrate 400 to 25 μm. This depth is recognized by a pattern recognition sensor (not shown) as comprising TSV 401-403, as shown in FIG. 4C. When this pattern is present, the thickness of wafer 40 is known to be between approximately 25 μm and 21 μm. As the wafer thinning process continues, the pattern produced by TSV 401-404, as shown in FIG. 4D, indicates that the thickness of backside substrate 400 has reached at least 20 μm. This pattern represents the lowest desired thickness of wafer 40. Accordingly, the wafer thinning process would stop as the pattern of TSV 401-404 is detected by the pattern detector.

It should be noted that various additional and/or alternative embodiments of the present invention may use processes other than a pattern detector in order to detect the progress of the wafer thinning. Optical methods, such as laser and IR systems may be used to determine the endpoint of the polishing by examination of the TSV. Additionally, current detection may also be used to monitor the thickness of the backside substrate during thinning. Current sensors, which may be shared by both grinding and polishing elements or individually associated therewith, are then used to measure the changes in current in the wheel or platen motor of the wafer thinning machine and/or the changes caused by eddy current.

Figure 4E:
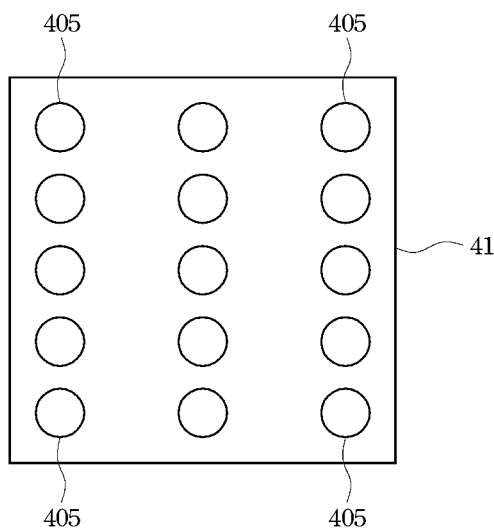
FIG. 4E is planar top view of a pattern formed on a surface of a stacked wafer during a wafer thinning process configured according to one embodiment of the present invention.

It should be noted that, although FIGS. 4A-4D are shown with TSV 401-404 having varied widths or diameters, alternative and/or additional embodiments of the present invention may be fabricated using TSV of the same width or diameter. An example of such an embodiment is shown in FIG. 4E. Instead of forming the patterns with different size TSV, wafer 41 has been fabricated with TSV 405, each having the same diameter.

Figure 5:
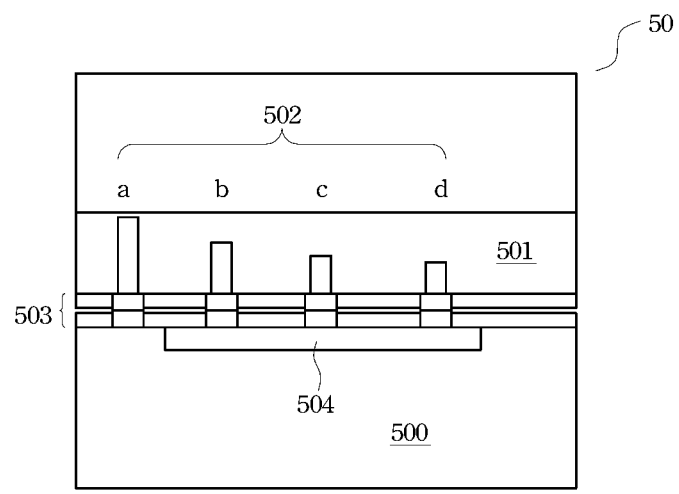
FIG. 5 is a cross-sectional view of a stacked IC having a wafer thinning system configured according to one embodiment of the present invention.

FIG. 5 is a cross-sectional view of stacked IC 50 having a wafer thinning system configured according to one embodiment of the present invention. Stacked IC 50 comprises two wafer dies joined at bonding region 503. The front-side wafer die comprises substrate 500 and active region 504, among other things. The backside wafer die includes substrate 501 and TSV 502. TSV 502 is formed at multiple, known depths that become progressively shallower from TSV 502a to TSV 502d (i.e., graded). Additionally, TSV 502b-d is connected to active region 504 while TSV 502a is not. This selective connection between TSV 502 and active device region 504 allows a more complete thickness indicator to be fabricated without a limitation based on the number of TSV to be formed for connecting active region 504. Thus, while TSV 502a is useful to designate the thickness where grinding should be replaced by polishing, it does not have to be connected into active region 504.

Figure 6:
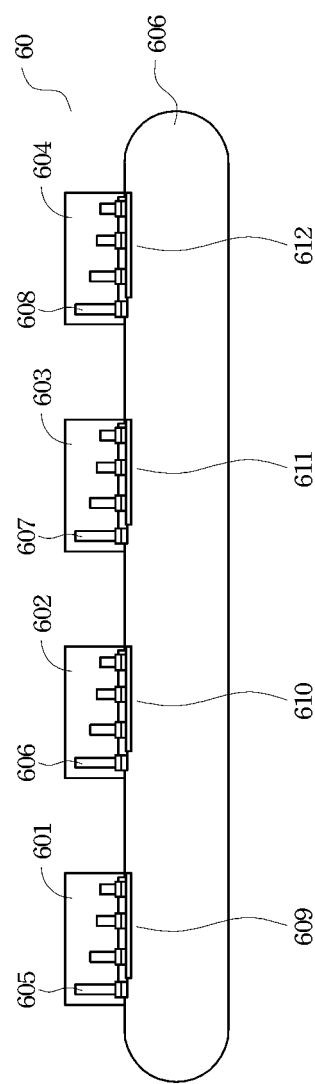
FIG. 6 is a cross-sectional view of a C2W stacked wafer incorporating a wafer thinning system configured according to one embodiment of the present invention.

It should be noted that the various embodiments of the present invention may be used in any semiconductor device fabrication process, such as wafer-to-wafer (W2W), chip-to-wafer (C2W), chip-to-chip (C2C), and the like. FIG. 6 is a cross-sectional view of C2W stacked wafer 60 incorporating a wafer thinning system configured according to one embodiment of the present invention. Wafer 600 is processed to include active device regions 609-612. Individual IC chips 601-604 have been separately fabricated, tested, and separated. IC chips 601-604 include thickness indicator TSV 605-608, respectively. These separate IC chips 601-604 are then bonded to wafer 600 at locations corresponding to active device regions 609-612. When C2W stacked wafer 60 enters the wafer thinning process, grinding and polishing occur on the backside substrate of IC chips 601-604. A detection method detects when each of the individual TSV in thickness indicator TSV 605-608 are exposed. Once the backend substrate for each of IC chips 601-604 has been thinned to the desired level, the stacked die may be separated from C2W stacked wafer 60 for use.

It should be noted that any of the detection methods described in the various methods above may be used to detect the exposure of the individual TSV in thickness indicator TSV 605-608. Such detection methods include current monitoring (such as wheel or platen motor current and eddy current), optical pattern recognition, laser and IR measurement systems, optical microscopes (OM), scanning electron microscopes (SEM), and the like.

Figure 7:
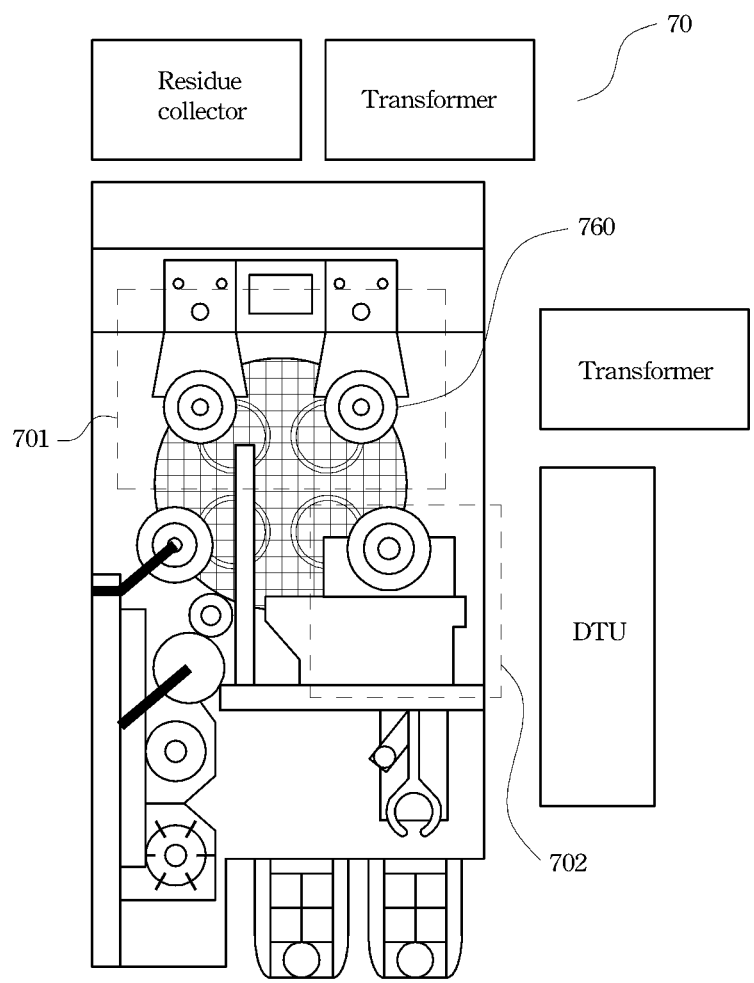
FIG. 7 is a diagram illustrating a wafer processing system configured according to one embodiment of the present invention.

FIG. 7 is a diagram illustrating processing system 70 configured according to one embodiment of the present invention. Processing system 70 positions wafer 700 under the processing areas of processing system 70 using a wheel or platen. The first area, grinding region 701 includes replaceable grinding pads on grinding elements that have current sensors formed therein. The grinding from grinding region 701 continues until the current change is detected when the first set of device structures are reached. Device structures can be structures such as TSV, trenches, alignment marks, and the like. Wafer 700 is then rotated on the platen or wheel such that the region that was previously under grinding region 701 is now positioned under CMP region 702. CMP region 702 has polishing elements that have replaceable polishing surfaces thereon. CMP is performed on the substrate damaged by the grinding to repair and continue to remove the material from the backside of wafer 700 to reach the desired thickness. Detection features, such as those that have been disclosed herein, including additional current sensors within the polishing elements, are incorporated into CMP region 702 to detect when this desired thickness is reached.

It should be noted that the wafer thinning tool illustrated in FIG. 7 is only one example of a wafer thinning tool that may be configured according to various embodiments of the present invention. Illustration of processing system 70 is not intended to limit the implementation of the present invention in any way.

Figure 8:
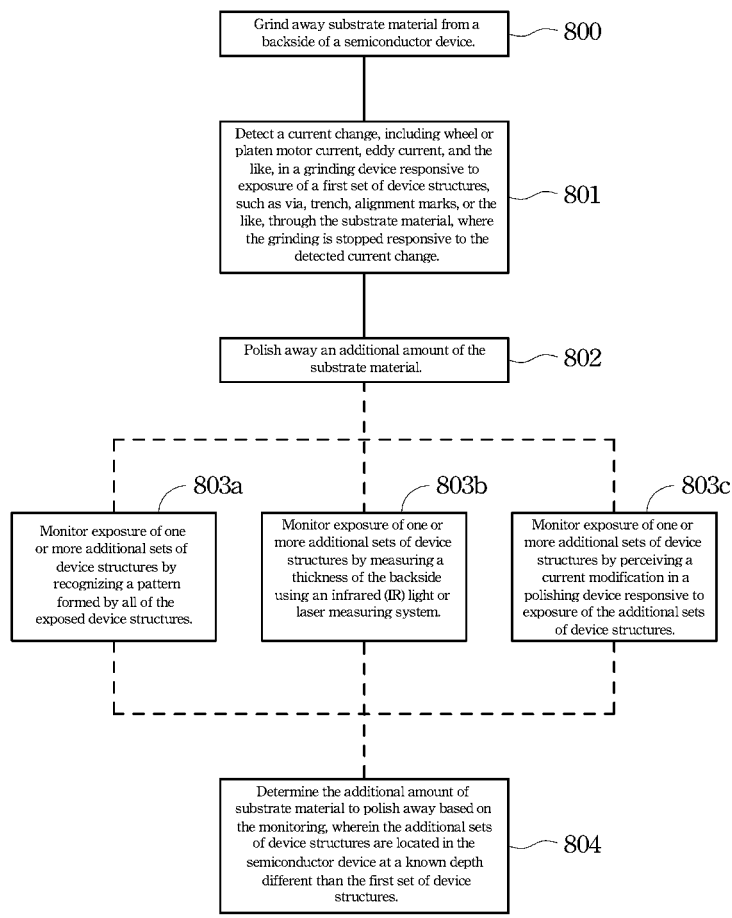
FIG. 8 is a flowchart illustrating example steps executed to implement one embodiment of the present invention.

FIG. 8 is a flowchart illustrating example steps executed to implement one embodiment of the present invention. In step 800, substrate material is ground away from a backside of a semiconductor device. A current change, including wheel or platen motor current, eddy current, and the like, is detected, in step 801, within a grinding device responsive to exposure of a first set of device structures, such as via, trench, alignment marks, or the like, through the substrate material, where the grinding is stopped responsive to the detected current change. In step 802, an additional amount of the substrate material is polished away. Exposure of additional sets of device structures may be monitored by alternative means. Selected alternative methods are presented here. In alternative step 803a, exposure of one or more additional sets of device structures is monitored by recognizing a pattern formed by all of the exposed device structures. Alternatively, in step 803b, exposure of one or more additional sets of device structures is monitored by measuring a thickness of the backside using an infrared (IR) light or laser measuring system. Alternatively, in step 803c, exposure of one or more additional sets of device structures is monitored by perceiving a current modification in a polishing device responsive to exposure of the additional sets of device structures. In step 804, the additional amount of substrate material to polish away is determined based on the monitoring, where the additional sets of device structures are located in the semiconductor device at a known depth different than the first set of device structures.

Figure 9:
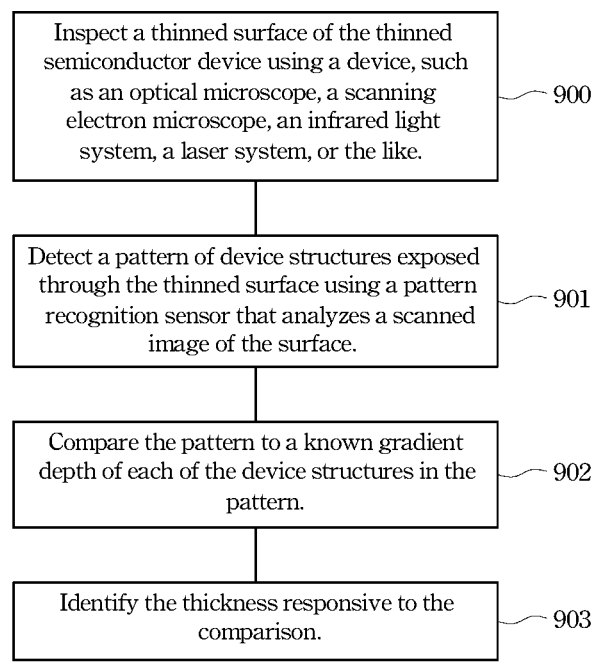
FIG. 9 is a flowchart illustrating example steps executed to implement one embodiment of the present invention.

FIG. 9 is a flowchart illustrating example steps executed to implement one embodiment of the present invention. In step 900, a thinned surface of the thinned semiconductor device is inspected using a device, such as an optical microscope, a scanning electron microscope, an infrared light system, a laser system, or the like. A pattern of device structures exposed through the thinned surface is detected, in step 901, using a pattern recognition sensor that analyzes a scanned image of the surface. The pattern is compared to a known gradient depth of each of the device structures in the pattern in step 902. In step 903, the thickness is identified responsive to the comparison.

Figure 10:
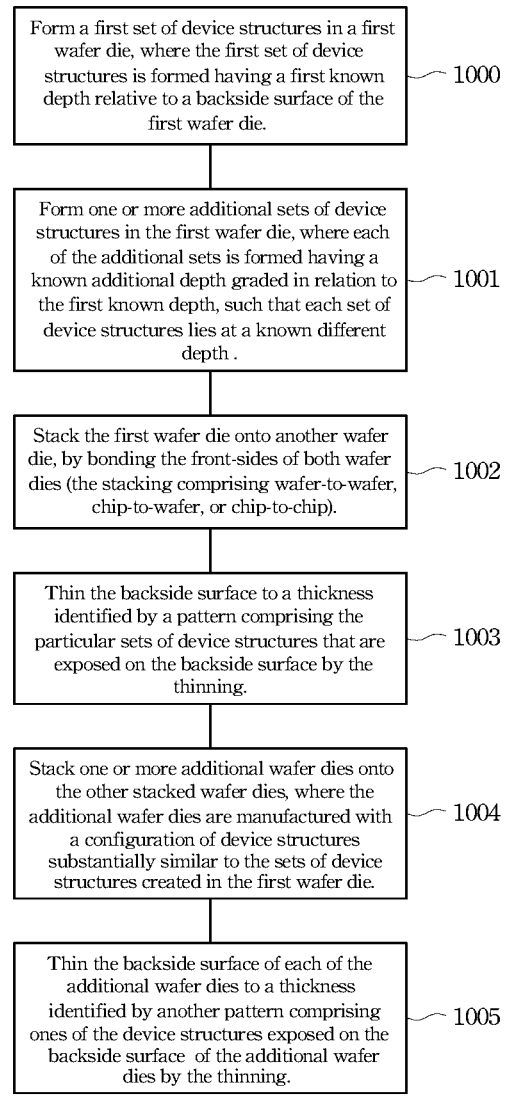
FIG. 10 is a flowchart illustrating example steps executed to implement one embodiment of the present invention.

FIG. 10 is a flowchart illustrating example steps executed to implement one embodiment of the present invention. In step 1000, a first set of device structures is formed in a first wafer die having a first known depth relative to a backside surface of the first wafer die. In step 1001, one or more additional sets of device structures are formed in the first wafer die, where each of the additional sets is formed having a known additional depth graded in relation to the first known depth, such that each set of device structures lies at a known different depth. The first wafer die is stacked onto another wafer die, in step 1002, by bonding the front-sides of both wafer dies (the stacking comprising wafer-to-wafer, chip-to-wafer, or chip-to-chip). The backside surface is thinned, in step 1003, to a thickness identified by a pattern comprising the particular sets of device structures that are exposed on the backside surface by the thinning. One or more additional wafer dies are stacked onto the other stacked wafer dies, in step 1004, where the additional wafer dies are manufactured with a configuration of device structures substantially similar to the sets of device structures created in the first wafer die. The backside surface of each of the additional wafer dies is then thinned, in step 1005, to a thickness identified by another pattern comprising ones of the device structures exposed on the backside surface of the additional wafer dies by the thinning.

These and other problems are generally solved or circumvented, and technical advantages are generally achieved, by preferred embodiments of the present invention which forms the means for controlling the grinding/polishing processes directly in the wafer being thinned. The wafer die is manufactured to include multiple sets of device structures, such as via, trenches, alignment marks, or the like. Each set of these structures is formed at a specific, known depth relative to the backside surface. Moreover, each set is at a different, known depth, such that a gradient depth exists across the multiple sets.

As grinding begins, sensors in the grinding elements detect changes or fluctuations in the current passing through the grinding machine. These current changes or fluctuations come from the grinding surfaces coming into contact with the various ones of the device structures. The current sensor may then signal the grinding machine to stop when the current changes by a specific amount corresponding to the grinding surface hitting a specific set of device structures.

Once the grinding process stops, the polishing may begin to repair the surface and further remove the substrate material from the backside surface. Additional monitoring of the backside surface continues during polishing to determine a pattern of device structures that are successively exposed during the polishing part of the thinning process. The exposed device structures may, therefore, also control the polishing process as well.

After thinning, the configuration of the pattern formed by the exposed device structures may also be used to inspect and determine the final thickness of the substrate. Because each of the device structures is placed at a known depth, this information may be used to determine the final thickness.

FIGS. 11-14 illustrate various intermediate steps of forming an interconnect structure between two bonded wafers or dies in accordance with some embodiments. Embodiments such as those discussed above form through vias (TVs) in a first substrate prior to bonding, and thereafter thins the first substrate to expose the through vias. Embodiments such as those disclosed below with reference to FIGS. 11-14 bond a first substrate and a second substrate, and thereafter form through vias from a backside of the substrate. As discussed in greater detail below, a width of the through vias will be modified dependent upon a depth of the via, thereby providing a structure having different widths of through vias.

Figure 11:
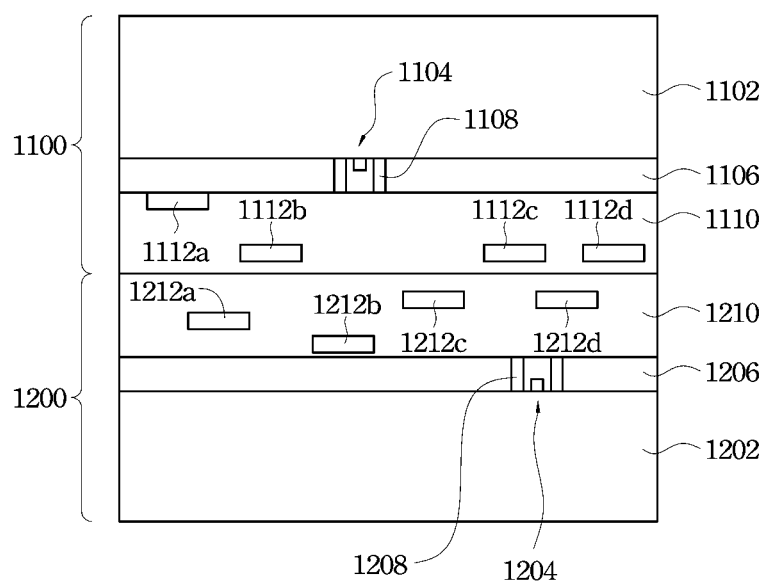
FIGS. 11-14 are various cross-sectional views illustrating formation of a device in accordance with some embodiments.

Referring first to FIG. 11, there is shown a first wafer 1100 bonded to a second wafer 1200. In an embodiment, the second wafer 1200 has similar features as the first wafer 1100, and for the purpose of the following discussion, the features of the second wafer 1200 having reference numerals of the form "12xx" are similar to features of the first wafer 1100 having reference numerals of the form "11xx," the "xx" being the same numerals for the first wafer 1100 and the second wafer 1200. The various elements of the first wafer 1100 and the second wafer 1200 will be referred to as the "first <element> 11xx" and the "second <element> 12xx," respectively.

In an embodiment, the first wafer 1100 comprises a first substrate 1102 having a first electrical circuit (illustrated collectively by first electrical circuitry 1104) formed thereon. The first substrate 1102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The first electrical circuitry 1104 formed on the first substrate 1102 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the first electrical circuitry 1104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, image sensors, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 11 is a first inter-layer dielectric (ILD)/inter-metallization dielectric (IMD) layer 1106. The first ILD layer 1106 may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the first ILD layer 1106 may comprise a plurality of dielectric layers.

First contacts 1108 are formed through the first ILD layer 1106 to provide an electrical contact to the first electrical circuitry 1104. The first contacts 108 may be formed, for example, by using photolithography techniques to deposit and pattern a photoresist material on the first ILD layer 1106 to expose portions of the first ILD layer 1106 that are to become the first contacts 1108. An etch process, such as an anisotropic dry etch process, may be used to create openings in the first ILD layer 1106. The openings may be lined with a diffusion barrier layer and/or an adhesion layer (not shown), and filled with a conductive material. The diffusion barrier layer comprises one or more layers of TaN, Ta, TiN, Ti, CoW, or the like, and the conductive material comprises copper, tungsten, aluminum, silver, and combinations thereof, or the like, thereby forming the first contacts 1108 as illustrated in FIG. 11.

One or more intermetallization (IMD) layers 1110 and first interconnect lines 1112a-1112d (collectively referred to as first interconnect lines 1112) form metallization layers over the first ILD layer 1106. Generally, the one or more IMD layers 1110 and the associated metallization layers are used to interconnect the electrical circuitry to each other as discussed above and to provide an external electrical connection. The IMD layers 1110 may be formed of a low-K dielectric material, such as fluorosilicate glass (FSG) formed by PECVD techniques or high-density plasma chemical vapor deposition (HDPCVD) or the like, and may include intermediate etch stop layers. External contacts (not shown) may be formed in an uppermost layer.

It should also be noted that one or more etch stop layers (not shown) may be positioned between adjacent ones of the ILD layers, e.g., the first ILD layer 1106, and the IMD layers 1110. Generally, the etch stop layers provide a mechanism to stop an etching process when forming vias and/or contacts. The etch stop layers are formed of a dielectric material having a different etch selectivity from adjacent layers, e.g., the underlying first substrate 1102 and the overlying dielectric layers (e.g., ILD layer 1106 and IMD layers 1110). In an embodiment, etch stop layers may be formed of SiN, SiCN, SiCO, CN, combinations thereof, or the like, deposited by CVD or PECVD techniques.

In some embodiments, the first wafer 1100 is a backside illumination sensor (BIS) and the second wafer 1200 is a logic circuit, such as an ASIC device. In this embodiment, the electrical circuitry 1104 includes photo active regions, such as photo-diodes formed by implanting impurity ions into the epitaxial layer. Furthermore, the photo active regions may be a PN junction photo-diode, a PNP photo-transistor, an NPN photo-transistor or the like. The BIS sensor may be formed in an epitaxial layer over a silicon substrate.

The second wafer 1200 may comprise a logic circuit, an analog-to-digital converter, a data processing circuit, a memory circuit, a bias circuit, a reference circuit, and the like.

In some embodiments, the first wafer 1100 and the second wafer 1200 are arranged with the device sides of the first substrate 1102 and the second substrate 202 facing each other as illustrated in FIG. 11. As discussed in greater detail below, openings will be formed extending from a backside (opposite the device side) of the first wafer 1100 to the selected portions of the first interconnect lines 1112 and/or the second interconnect lines 1212. The openings will be subsequently filled with a conductive material, thereby forming an electrical contact on the backside of the first wafer to respective interconnect lines of the first wafer 1100 and the second wafer 1200. Widths of the openings will be adjusted to compensate for the desired depth.

The first wafer 1100 and the second wafer 1200 may be bonded using, for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof and/or the like.

It should be noted that the bonding may be at wafer level, wherein the first wafer 1100 and the second wafer 1200 are bonded together, and are then singulated into separated dies. Alternatively, the bonding may be performed at the die-to-die level, or the die-to-wafer level.

Figure 12:
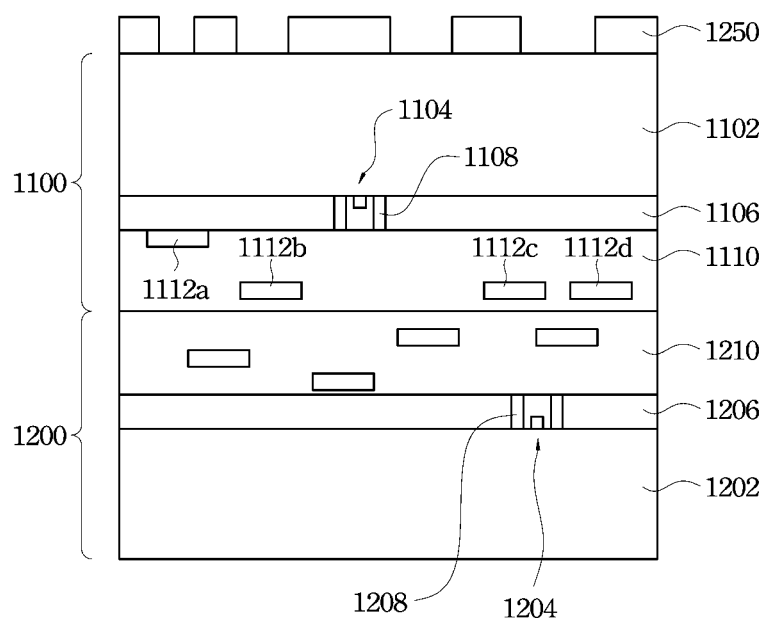

Referring now to FIG. 12, a thinning process is performed and a mask layer 1250 patterned to have openings 1252A-D (collectively referred to as openings 1252) is formed along a backside of the first substrate 1102 in accordance with some embodiments. After the first wafer 1100 and the second wafer 1200 are bonded, a thinning process may be applied to the backside of the first substrate 1102. In an embodiment in which the first substrate 1102 is a BIS sensor, the thinning process serves to allow more light to pass through from the backside of the first substrate to the photo-active regions without being absorbed by the substrate. In an embodiment in which the BIS sensor is fabricated in an epitaxial layer, the backside of the first substrate 1102 may be thinned until the epitaxial layer is exposed. The thinning process may be implemented by using suitable techniques such as grinding, polishing, a SMARTCUT® procedure, an ELTRAN® procedure, and/or chemical etching.

Also shown in FIG. 12 is the mask layer 1250 patterned to have openings 1252. As discussed in greater detail below, electrical connections will be formed extending from a backside of the first wafer 1100 to select ones of the first interconnect lines 1112 and/or the second interconnect lines 1212 of the second wafer 1200 in accordance with the pattern of the openings 1252. For example, the first opening 112a is patterned to form an electrical connection to the first interconnect line 1112a, the first opening 1112b is patterned to form an electrical connection to the first interconnect line 1112b, the first opening 1112c is patterned to form an electrical connection to the second interconnect line 1212c, and the first opening 112d is patterned to form an electrical connection to the first interconnect lines 1112c-1112d and the second interconnect line 2112d.

In some embodiments, the mask layer 1250 may include, for example, a photosensitive material and patterned to form the first openings 1250 using, for example, photolithography techniques. Generally, photolithography techniques involve depositing a photoresist material, which is subsequently irradiated (exposed) and developed to remove a portion of the photoresist material. The remaining photoresist material protects the underlying material from subsequent processing steps, such as etching.

Other layers may be used in the patterning process. For example, one or more optional hard mask layers may be used. Generally, one or more hard mask layers may be useful in embodiments in which the etching process requires masking in addition to the masking provided by the photoresist material. During the subsequent etching process to pattern the first substrate 1102, the patterned photoresist mask will also be etched, although the etch rate of the photoresist material may not be as high as the etch rate of the first substrate 1102. If the etch process is such that the patterned photoresist mask would be consumed before the etching process is completed, then an additional hard mask may be utilized. The material of the hard mask layer or layers is selected such that the hard mask layer(s) exhibit a lower etch rate than the underlying materials, such as the materials of the first substrate 1102.

Additionally, an optional anti-reflection coating (ARC) layer may be used. The ARC layer reduces the reflection of the exposure light used during the photolithography process to pattern a patterned mask (not shown), which reflection may cause inaccuracies in the patterning. The ARC layer may be formed of a nitride material (e.g., silicon nitride), an organic material (e.g., silicon carbide), an oxide material, high-k dielectric, and the like.

Figure 13:
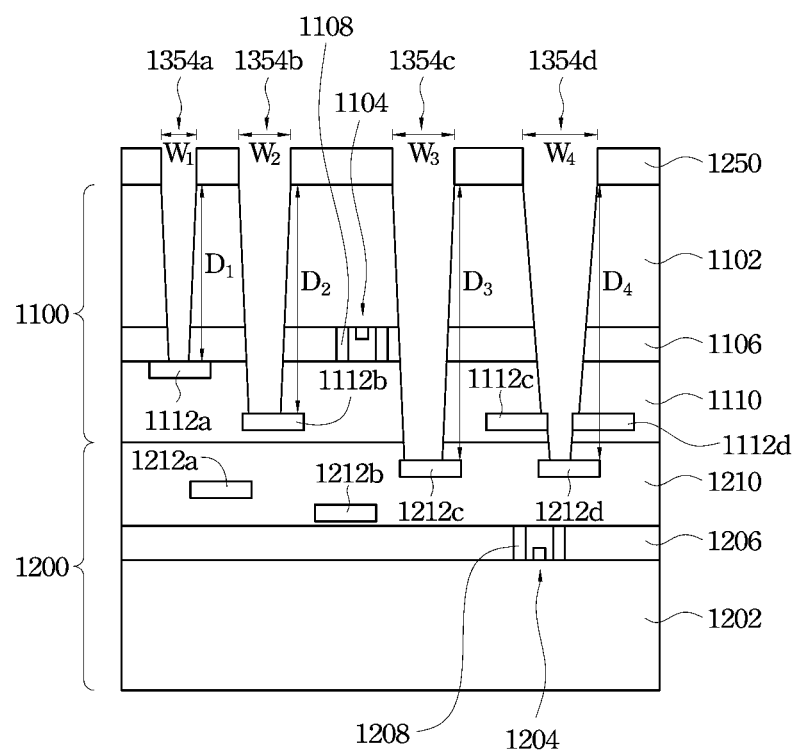

FIG. 13 illustrates formation of via openings 1354a-1354d (collectively referred to as via openings 1354) in accordance with some embodiments. In some embodiments, the via openings 1354 are formed simultaneously using, for example, one or more suitable etching processes, such as a dry etch, an anisotropic wet etch, or any other suitable anisotropic etch or patterning process.

As illustrated in FIG. 13, widths of the openings 1354 are adjusted to account for differing depths of the individual via openings 1354 and a tapering of sidewalls of the openings 1354. For example, via opening 1354a has a shortest depth $D_1$, and accordingly has a smallest $W_1$, while via opening 1354b has a greater depth $D_2$, and accordingly has a greater width $W_2$. Via opening 1354c has the next greatest depth $D_3$, and has a width $W_3$ greater than width $W_2$. Via opening 1354d illustrates an interconnection formed between the first interconnections 1112c-1112d on the first wafer 100 and the second interconnection 2112d on the second wafer 200. The via opening 1354d has a width $W_4$ adjusted to accommodate the depth $D_4$. In some embodiments, the varying widths of the via openings 1354 allow for differing loading effects during etching such that varying depths of vias may occur simultaneously with an etch.

The via openings 1354 may be formed to various metallization layers. For example, the via opening 1354a is formed to a first metallization layer (M1) interconnect line 1112a, and the via opening 1354b is formed to a top metallization layer (Mn) interconnect line 1112b. The via openings 1354 may also provide a direct electrical connection to a metallization layer on the second wafer 1200. For example, the via opening 1354c illustrates an opening directly to a top metallization layer interconnect line 2112c on the second wafer 1200. The via opening 1354d illustrates a via opening to interconnect lines on the first wafer 1100 and the second wafer 1200, such as the first interconnect lines 1112c-d in a top metallization layer of the first wafer 1100 and the second interconnect lines 2112d in a top metallization layer of the second wafer 1200. Electrical connections may be made to other metallization layers.

As illustrated in FIG. 13, the opening 1354d extends to the first interconnect lines 1112c-1112d and to the second interconnect line 1212d. In an embodiment, the first interconnect lines 1112c and 112d are formed of suitable metal materials such as copper, which exhibits a different etching rate (selectivity) than the first IMD layers 1110 and the second IMD layers 1210. As such, the first interconnect lines 1112c and 1112d function as a hard mask layer for the etching process to extend the opening 1354d to the second interconnect line 1212d. A selective etching process may be employed to etch the first ILD layers 110 rapidly while etching only a portion of the first interconnect lines 1112a and 1112b. The exposed portion of the first interconnect lines 1112c and 1112d may be partially etched away, thereby forming a recess, as the etch process continues toward the second interconnect line 1212d. The depth of the recess may vary depending on a variety of applications and design needs.

The first interconnect lines 1112c and 1112d may be portions of a single interconnect. For example, the first interconnect lines 1112c and 1112d may be a single conductive pad having a hole formed therethrough. In this manner, the via opening 1354d extends through the hole in the single conductive pad, wherein the conductive pad acts as a hard mask for the continued etch to the second interconnect line 1212d.

Figure 14:
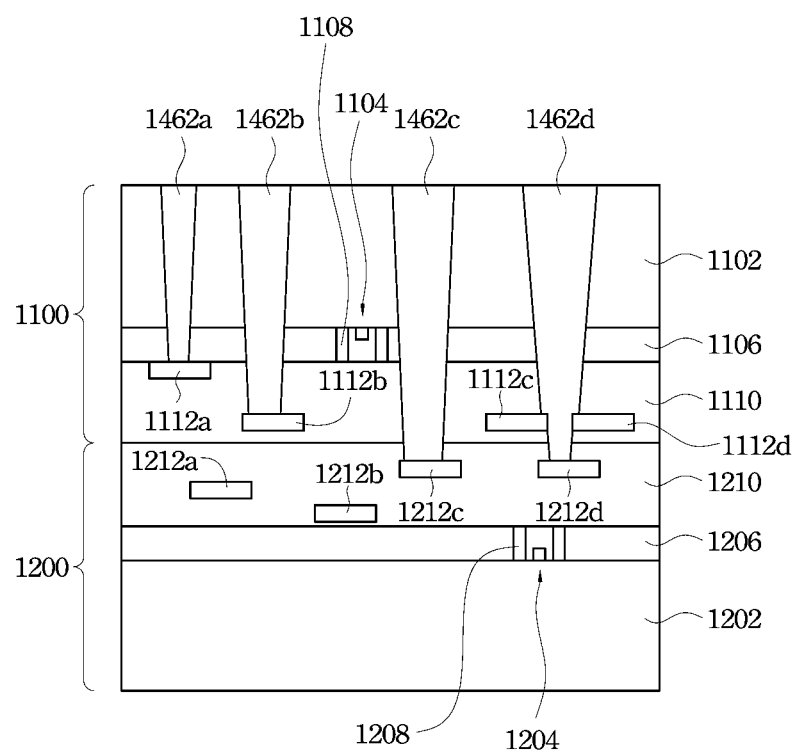

Referring now to FIG. 14, there is illustrated a conductive material formed within the via openings 1354 in accordance with various embodiments. In some embodiments, the conductive material may be formed by depositing one or more diffusion and/or barrier layers and depositing a seed layer. For example, a diffusion barrier layer comprising one or more layers of Ta, TaN, TiN, Ti, CoW, or the like is formed along the sidewalls of the via openings 1354. The seed layer may be formed of copper, nickel, gold, any combination thereof and/or the like. The diffusion barrier layer and the seed layer may be formed by suitable deposition techniques such as PVD, CVD and/or the like. Once the seed layer has been deposited in the openings, a conductive material, such as tungsten, titanium, aluminum, copper, any combinations thereof and/or the like, is filled into the via openings 1354, using, for example, an electro-chemical plating process, thereby forming conductive plugs 1462*a-d* (collectively referred to as conductive plugs 1462).

FIG. 14 also illustrates removal of excess materials, e.g., excess conductive materials and/or excess materials of the mask layer 1250, from the backside of the first substrate 1102. In this example, the excess materials may be removed using an etch process, a planarization process (e.g., a CMP process), or the like. In some embodiments, a portion of the mask layer 1250 may remain to protect the backside of the first substrate 1102.

Embodiments such as those discussed above provides conductive plugs 1462 that can directly couple conductive features on one or more wafers (e.g., first wafer 1100 and second wafer 1200) and may cross a bonding interface. The conductive plugs 1462 may interconnect circuitry on the wafers (e.g., first wafer 1100 and second wafer 1200). Further, the conductive plugs 1462 may be formed through additional substrates, such as a third or fourth wafer.

Thereafter, further processing may be performed. For example, passivation layers, redistribution layers, underbump metallization layers, and the like may be formed, and the structures may be singulated and/or packaged. Other processes may be performed and other structures may be formed.

Figure 15:
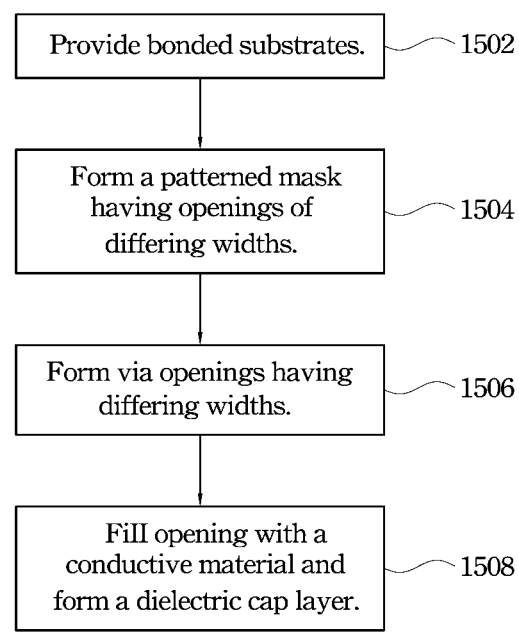
FIG. 15 is a flowchart illustrating example steps executed to implement one embodiment of the present invention.

FIG. 15 is a flowchart illustrating example steps executed to implement one embodiment of the present invention. In step 1502, bonded substrates are provided. In some embodiments, the bonded substrates include a first wafer and a second wafer bonded to each other. In some embodiments, the first wafer and the second wafer are bonded such that the device sides of the wafers face each other. The bonded substrates may alternatively include chip-to-wafer or chip-to-chip configurations. In step 1504, a mask is formed over the first wafer, wherein the mask is patterned to have openings of varying widths. The openings represent a location of via openings to be formed in the first substrate. The widths of the openings are determined in part by the desired depth of the via opening. The mask may include, for example, a photoresist, a hard mask, an ARC, and/or the like.

In step 1506, via openings are formed extending from a backside of the first substrate to interconnect structures formed on the first substrate and/or the second substrate in accordance with the patterned mask. Thereafter, in step 1508, the via openings are filled with a conductive material.

In accordance with a preferred embodiment of the present invention, a method includes grinding away substrate material from a backside of a semiconductor device. A current change is detected in a grinding device responsive to exposure of a first set of device structures through the substrate material, where the grinding is stopped in response to the detected current change. Polishing continues to remove an additional amount of the substrate material. Exposure of one or more additional sets of device structures through the substrate material is monitored to determine the additional amount of substrate material to remove, where the one or more additional sets of device structures are located in the semiconductor device at a known depth different than the first set.

In accordance with another preferred embodiment of the present invention, a stacked semiconductor device includes two or more bonded semiconductor components in a stack having an exposed backside surface of a substrate. A plurality of device structures is located within the substrate where each device structure in the plurality has a known gradient depth in relation to the exposed backside surface.

In accordance with another preferred embodiment of the present invention, a method for determining a thickness of a thinned semiconductor device includes inspecting a thinned surface of the thinned semiconductor device to detect a pattern of device structures exposed through the thinned surface. The pattern is then compared to a known gradient depth of each of the device structures in the pattern to identify the thickness of the semiconductor device.

In accordance with another preferred embodiment of the present invention, a method for thinning a semiconductor wafer includes grinding a backside surface of the semiconductor wafer to remove substrate material. The grinding is ended at a predetermined depth identified by a current change detected in the grinding machine responsive to a grinding pad contacting a first set of device structures exposed through the substrate material. The backside surface of the wafer is then polished to further remove the substrate material. The polishing ends at a desired depth also identified by one or more additional sets of device structures exposed through the substrate material. These additional sets of device structures are positioned at a known gradient depth with respect to the first set.

In accordance with another preferred embodiment of the present invention, a wafer thinning machine includes one or more grinding elements each having a replaceable coarse grinding surface and one or more polishing elements, each having a replaceable fine grinding surface. There is a platen for rotatably and selectively positioning a semiconductor wafer under either the grinding elements or the polishing elements. A current sensor, associated with the grinding elements, detects any current changes caused by interaction between the semiconductor wafer and the grinding elements.

In accordance with another preferred embodiment of the present invention, a method for manufacturing a stacked integrated circuit includes forming a first set of device structures in a first wafer die, where the first set of device structures are formed having a first known depth relative to a backside surface for the first wafer die. One or more additional sets of device structures are formed in the first wafer die, where each of the additional sets of device structures is formed having a known additional depth graded in relation to the first depth, such that each set of device structures lies at a known different depth. The first wafer die is stacked onto another wafer die, where the front side of the first wafer die is bonded to the front-side of the other wafer die. The backside surface of the first wafer die is then thinned to a thickness identified by a pattern comprising ones of the sets of device structures exposed on the backside surface by the thinning.

An advantage of a preferred embodiment of the present invention is that the coarse grinding may be accomplished with greater accuracy to the appropriate level without the physical limitations found in the mechanical thickness dial.

A further advantage of a preferred embodiment of the present invention is that after the wafer has been thinned, the pattern of device structures that have been exposed on the backside surface may be used to determine and/or verify the thickness of the thinned wafer.

In some embodiments, a method is provided. The method includes providing a bonded structure, wherein the bonded structure includes a first substrate having a first plurality of metallization layers disposed thereon and a second substrate having a second plurality of metallization layers disposed thereon. A plurality of via openings is formed through the first substrate, wherein the plurality of via openings comprising a first via opening have a first width and a second via opening have a second width, the first width being different than the second width. Thereafter, a plurality of conductive plugs are formed such that the plurality of conductive plugs includes a conductive plug in each of the via openings. The conductive plugs further include a first conductive plug in the first via opening and a second conductive plug in the second via opening.

In some embodiments another method is provided. The method includes providing a first substrate having one or more first metallization layers disposed on a device side of the first substrate and a second substrate, the second substrate having one or more second metallization layers disposed on a device side of the second substrate. The first substrate is bonded to the second substrate such that device side of the first substrate faces the device side of the second substrate. A patterned mask is formed on a backside of the first substrate, such that the patterned mask has a first opening and a second opening. A first trench is formed in the first substrate in the first opening of the patterned mask, and a second trench is formed in the first substrate in the second opening of the patterned mask, the first trench having a first width less than a second width of the second trench. The first trench and the second trench are filled with conductive material, thereby forming a first conductive plug and a second conductive plug.

In some embodiments, a device is provided. The device includes a first substrate having a plurality of first metallization layers disposed thereon, and a second substrate having a plurality of second metallization layers. The first substrate is bonded to the second substrate. The device also includes a plurality of conductive plugs extending from a surface of the first substrate, wherein the plurality of conductive plugs includes a first conductive plug and a second conductive plug. The first conductive plug has a first width and a first depth, and the second conductive plug has a second width and a second depth, wherein the first width being greater than the second width and the first depth being greater than the second depth.

Although the present invention and its advantages have been described in detail, it should be understood that various changes, substitutions, and alterations can be made herein without departing from the spirit and scope of the invention as defined by the appended claims.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
providing a bonded structure, the bonded structure comprising a first substrate having a first plurality of metallization layers disposed thereon, and a second substrate having a second plurality of metallization layers disposed thereon;
forming a plurality of via openings through the first substrate, the plurality of via openings comprising a first via opening having a first width and a second via opening having a second width, the first width being different than the second width; and
forming a plurality of conductive plugs, the plurality of conductive plugs comprising a conductive plug in each of the via openings, the conductive plugs comprising a first conductive plug in the first via opening and a second conductive plug in the second via opening;
wherein:
the plurality of via openings are formed simultaneously;
the first conductive plug comprises a substantially direct linear route through the first substrate from the first via opening to:
a first interconnect of the first plurality of metallization layers; and
a second interconnect of the second plurality of metallization layers;
the first interconnect is laterally offset away from the second interconnect in a direction substantially parallel to a major surface of the first substrate; and
the substantially direct linear route is substantially perpendicular to the major surface of the first substrate.

2. The method of claim 1, wherein the first via opening has a first depth and the second via opening has a second depth, the first depth being greater than the second depth, the first width being greater than the second width.

3. The method of claim 1, wherein the forming the plurality of via openings comprises:
forming a mask layer over a backside of the first substrate; and
patterning the mask layer to have a first opening and a second opening, the first opening having a width greater than the second opening.

4. The method of claim 1, wherein the second conductive plug electrically couples a first interconnect of the first plurality of metallization layers to a second interconnect of the second plurality of metallization layers.

5. The method of claim 1, wherein:
the plurality of conductive plugs comprises a third conductive plug in a third via opening of the plurality of via openings;
the third conductive plug extends from a backside of the first substrate to a third interconnect in a first metallization layer of the first plurality of metallization layers; and
the second conductive plug extends from the backside of the first substrate to a fourth interconnect in a second metallization layer of the first plurality of metallization layers, the first metallization layer being different than the second metallization layer.

6. A method comprising:
providing a first substrate, the first substrate having one or more first metallization layers disposed on a device side of the first substrate;
providing a second substrate, the second substrate having one or more second metallization layers disposed on a device side of the second substrate;
bonding the first substrate to the second substrate such that the device side of the first substrate faces the device side of the second substrate;
forming a patterned mask on a backside of the first substrate, the patterned mask having a first opening and a second opening;
forming a first trench in the first substrate in the first opening of the patterned mask and a second trench in the first substrate in the second opening of the patterned mask, the first trench having a first width less than a second width of the second trench, the first trench exposing a first interconnect in the first metallization layers, the second trench exposing a second interconnect in the first metallization layers and a third interconnect in the second metallization layers, wherein the forming the first trench and the forming the second trench are performed simultaneously; and filling the first trench and the second trench with conductive material, thereby forming a first conductive plug and a second conductive plug.

7. The method of claim 6, wherein a depth of the first trench is less than a depth of the second trench.

8. The method of claim 7, further comprising:

forming a third trench in the first substrate, the third trench having a third width and a third depth, the third width being greater than the second width, the third trench having a depth greater than a depth of the second trench; and filling the third trench with conductive material, thereby forming a third conductive plug.

9. A method comprising:

providing a first substrate, the first substrate having a first conductive feature in a first metallization layer disposed on a device side of the first substrate;

providing a second substrate, the second substrate having a second conductive feature in a second metallization layer disposed on a device side of the second substrate;

bonding the first substrate to the second substrate such that device side of the first substrate faces the device side of the second substrate;

forming a first opening extending from a backside of the first substrate to the first conductive feature, the first opening having a first width;

forming a second opening extending from the backside of the first substrate to expose a third conductive feature in the first metallization layers and to the second conductive feature, the second opening having a second width, the second width being greater than the first width, the forming the first opening and the forming the second opening are performed simultaneously; and filling the first opening and the second opening with conductive material, thereby forming a first conductive plug in the first opening and a second conductive plug in the second opening, wherein the first conductive plug is electrically isolated from the second conductive plug.

10. The method of claim 9, further comprising:

forming a third opening extending from the backside of the first substrate to a fourth conductive feature in a third metallization layer, the third metallization layer being interposed between the first metallization layer and the second metallization layer, the third opening having a third width, the third width being greater than the first width and less than the second width; and filling the third opening with conductive material, thereby forming a third conductive plug.

11. The method of claim 10, wherein the third metallization layer is a metallization layer of the first substrate.

12. The method of claim 10, wherein the third metallization layer is a metallization layer of the second substrate.

13. The method of claim 10, wherein the forming the first opening, the forming the second opening, and the forming the third opening are performed simultaneously.

14. The method of claim 8, wherein the third trench exposes a fourth interconnect, the fourth interconnect being distinct from the first, second, and third interconnects.

15. The method of claim 14, wherein the fourth interconnect is in the first metallization layer.

16. The method of claim 14, wherein the fourth interconnect is in the second metallization layer.

17. The method of claim 14, wherein the forming the first trench, the forming the second trench, and the forming the third trench are performed simultaneously.

18. The method of claim 1, wherein the plurality of conductive plugs comprises a fourth conductive plug in a fourth via opening of the plurality of via openings, the fourth conductive plug extending from a backside of the first substrate to a fourth interconnect in a metallization layer of the second plurality of metallization layers.

19. The method of claim 1, wherein the first conductive plug is electrically isolated from the second conductive plug.

20. The method of claim 6, wherein the first conductive plug is electrically isolated from the second conductive plug.

* * * * *